(12) United States Patent
Duchesne et al.

(10) Patent No.: US 7,176,563 B2
(45) Date of Patent: Feb. 13, 2007

(54) ELECTRONICALLY GROUNDED HEAT SPREADER

(75) Inventors: Eric Duchesne, Granby (CA); Michael A. Gaynes, Vestal, NY (US)

(73) Assignee: International Business Machine Corporation, Armonk, NY (US)

( * ) Notice: Subject to any disclaimer, the term of this patent is extended or adjusted under 35 U.S.C. 154(b) by 54 days.

(21) Appl. No.: 10/665,997

(22) Filed: Sep. 18, 2003

(65) Prior Publication Data

US 2005/0062154 A1    Mar. 24, 2005

(51) Int. Cl.
*H01L 23/34* (2006.01)
(52) U.S. Cl. ............... 257/712; 257/713; 257/E23.101; 438/106; 438/122; 438/124
(58) Field of Classification Search .............. 257/712, 257/713; 438/106, 122, 124
See application file for complete search history.

(56) References Cited

U.S. PATENT DOCUMENTS

| | | | |
|---|---|---|---|
| 6,392,890 B1 * | 5/2002 | Katchmar | 361/705 |
| 6,489,668 B1 * | 12/2002 | Oda et al. | 257/675 |
| 6,518,660 B2 | 2/2003 | Kwon et al. | |
| 6,590,292 B1 * | 7/2003 | Barber et al. | 257/778 |

* cited by examiner

*Primary Examiner*—Zandra V. Smith
*Assistant Examiner*—Christy Novacek
(74) *Attorney, Agent, or Firm*—Scully, Scott, Murphy & Presser, P.C.; William E. Steinberg, Esq.

(57) ABSTRACT

Electronically grounded heat spreaders are employed in connection with the dissipation of heat, which is generated by electronic devices, such as semiconductor chips. Also provided is a novel method for the adhesive fastening of metallic heat spreaders to semiconductor chips through the combined use of electrically conductive and non-conductive adhesive materials.

10 Claims, 1 Drawing Sheet

ELECTRONICALLY GROUNDED HEAT SPREADER

BACKGROUND OF THE INVENTION

1. Field of the Invention

The present invention relates to electronically grounded heat spreaders employed in connection with the dissipation of heat, which is generated by electronic devices, and more particularly, relates to the unique adhesive fastening of metallic heat spreaders to semiconductor chips.

In particular, in the effectuation of adhesive attachments of metallic heat spreaders to the backsides of flip chips in order to dissipate heat from the latter, which is generated during operation of electronic devices employing the chips, it is an additional advantage to be able to electrically connect the flip chip to the heat spreader to gain in silicon performance if an electrical ground path can be established between the backside of the flip chip and the metallic heat spreader.

The aspects in compensating for any mismatches in coefficients of thermal expansion (CTE) and resultant contraction which are encountered between the various components of a wire bond or flip chip package or module including encapsulated semiconductor chips mounted on substrates, and with heat sinks supported on the chips in the form of heat spreaders, such as lids or caps, in order to reduce heat-induced warpage tending to separate the components and leading to failures of the electrical connects and ball grid arrays, adversely affecting the functioning and reliability of the packages has been widely addressed in the technology and industry. Nevertheless, notwithstanding the considerable efforts expended in order to solve the problems which are encountered, the utilization of the heat-spreading cap only balances the thermal dissipation above the substrate directly above the chip. The foregoing difficulties are encountered due to package warping as a result of thermal stresses generated, in that the normally utilized epoxy adhesives which cement the chip and cap may not match the coefficients of thermal expansion of the various components. One of the possible failure mechanisms is delamination of the epoxy interface between the chip and the cap as a result of thermally induced thermal stresses. Also, the tendency of the epoxy adhesive to absorb or desorb moisture may readily cause additional expansion and contraction and result in further warpage of the entire module structure, leading to an operative failure of the arrangement.

Currently, in the technology concerned with such electronic devices, adhesives which are constituted from electrically conductive epoxies (ECA) are a frequent choice in applications directed to the attaching of a heat spreader or a heat-dissipating lid or cap to the backside of a flip chip. However, the utilization of such electrically conductive epoxy adhesives is subject to various serious disadvantages. One such disadvantage is the inherently high modulus or coefficient of thermal expansion (CTE) of epoxies, which can readily range between several hundred thousand psi to over one million psi. Consequently, this class of epoxy materials is inherently subject to the weaknesses in that the adhesive bond between the chip backside and that of the heat spreader may be readily prone to fatigue due to the mismatch, which is encountered in the coefficients of thermal expansion (CTE) between the adhesive material and the metal lid or heat spreader, the latter of which is normally constituted of either copper or aluminum. Moreover, horizontal chip cracking can also be encountered at times due to an underfill laminate pulling away from the bottom surface of the chip at which location the chip is fastened to a substrate, such as a circuit board, laminate or ceramic material, and with the heat spreader pulling away at the top or the opposite surface of the chip.

As an alternative to employing the traditionally high modulus epoxies, which are utilized to adhesively interconnect the chips to the heat spreaders or metallic lids or caps fastened thereto, it is possible to employ low modulus epoxies, in effect, those of lower than one hundred thousand psi. From the standpoint of mechanical stress management, these epoxies fatigue less, and resultingly impart a lower stress causing a diminution of potential horizontal chip cracking. Nevertheless, they are subject to the drawback in that these epoxies are not heat resistant, whereas normal solder reflow temperatures required for BAT (Bond Assembly Testing) balling, of up to 250° C. and then card or substrate attachment will severely degrade adhesives formed of the low modulus epoxies, as well as any consisting of acrylics. Consequently, a loss of adhesion can be the result, as well as a degrading in thermal performance, thereby potentially rendering the entire adhesive interconnection between the heat spreaders or lids and the chips to be extremely unreliable, and the electronic device incorporating the latter as being essentially unusable.

In order to avoid the problems, which are presently being encountered in the technology, thermally conductive silicone adhesives have been employed in the attachment of heat spreaders to electronic components. However, although these adhesives comprise very low modulus materials and maintain their adhesive properties after demanding exposures to heat cycles, they are typically not electrically conductive. Thus, rendering silicone adhesives electrically conductive has not been successful; nevertheless recent advances in the development of electrically conductive silicones now render these adhesive materials a more viable choice for being employed in microelectronics.

2. Discussion of the Prior Art

In essence, utilizing the use of electrically non-conductive thermosetting silicone adhesives, which form a first type of connection in electronic devices of the type described, in conjunction with electrically conductive silicone adhesives forming electrical ground connections is disclosed in Kwon, et al., U.S. Pat. No. 6,518,660. In that instance, a substrate, preferably, but not necessarily constituted of a ceramic material, or which may also be a printed circuit board, is directly connected to a metallic heat spreader, which may consist of either aluminum or copper, through the intermediary of an electrically non-conductive thermosetting silicone adhesive. However, the surface of the chip facing the heat spreader is covered entirely with the electrically conductive epoxy or thermosetting electrically conductive silicone adhesive. Connected at and extending outwardly from the corners of the chip through suitable wiring is an electrically conductive silicone adhesive adapted to provide the appropriate electrical connection between the substrate and the chip and also the ground projections extending therebetween.

Furthermore, the utilization of an electrically conductive thermosetting silicone adhesive for microelectronics is also disclosed in a brochure of the Loctite Corporation, and which is intended to provide a resilient ground path for sensitive electronic devices, such commercially available electrically conductive bonding material or adhesive being identified as 5420 Heat Cure Silicone.

Although the Kwon, et al. U.S. Pat. No. 6,518,660 describes a semiconductor package with ground projections, wherein the front side of a flip chip attached in an integrated circuit to a substrate has an insulated underfill material, and wherein electrically conductive paths to ground points are provided with an electrically conductive epoxy adhesive, there is no provision of a heat spreader which is connected to a semiconductor chip by means of both electrically conductive and non-conductive silicone or epoxy adhesives in a manner pursuant to the invention.

SUMMARY OF THE INVENTION

Accordingly, in order to provide the inventively unique and novel connections or adhesive bonding between a metallic heat spreader, such as a lid or cap element, and the backside of a flip chip as utilized in electronic components, and with which there is formed an electronic module structure, whereby the metallic heat spreader is mechanically, thermally and electrically-conductively attached to the backside of the flip chip, which is effected by the simultaneous use of both a thermally conductive, electrically non-conductive silicone adhesive, and also an electrically conductive silicone adhesive.

Pursuant to a preferred embodiment of the invention, an electrically conductive silicone adhesive is dispensed onto a center portion of the chip backside in a quantity which is considered to be sufficient to achieve a specified bond area between the facing surfaces of the heat spreader and that of the chip. A thermally conductive, electrically non-conductive silicone adhesive is then dispensed in a desired pattern onto the chip backside so as to cover most of the remaining chip backside surface area extending about the electrically conductive silicone adhesive, thereby providing both the necessary electrical connection or connections between the heat spreader and the flip chip and concurrently also the required electrically non-conductive adhesion for the remaining areas, so as to inhibit any potential electrical failures due to electrical short-circuiting, as well as noise transmission to signal circuits running nearby. Thus, although it is possible to simply use an electrically conductive adhesive material over the entire chip backside surface, as in the instance of the Kwon, et al. U.S. Pat. No. 6,518,660, this raises the potential for the adhesive to flow from the chip onto the carrier or substrate surface in an undesirable manner, providing electrical failure mechanisms, which include the aforementioned short-circuiting, as well as noise being communicated to signal circuits.

Accordingly, it is an object of the present invention to provide an electronic module structure in which a heat spreader is connected or bonded to the backside of a flip chip through the intermediary of both an electrically conductive adhesive and an electrically non-conductive thermally resistant adhesive.

Another object of the present invention is to provide a connection between a heat spreader and a flip chip backside through the intermediary of an electrically conductive thermosetting silicone adhesive which is essentially surrounded by a non-conductive thermally resistant adhesive so as to provide good mechanical adhesion between the heat spreader and the flip chip, while concurrently enabling electrical communication therebetween.

Another object of the present invention is to provide a method for forming a connection or bonding between a heat spreader constituted of a metallic material and the backside of a flip chip concurrently utilizing both an electrically conductive adhesive and an electrically non-conductive adhesive.

BRIEF DESCRIPTION OF THE DRAWINGS

Reference may now be made to the following detailed description of a preferred embodiment of the invention, taken in conjunction with the accompanying drawings; in which.

DETAILED DESCRIPTION OF A PREFERRED EMBODIMENT

Figure 1:
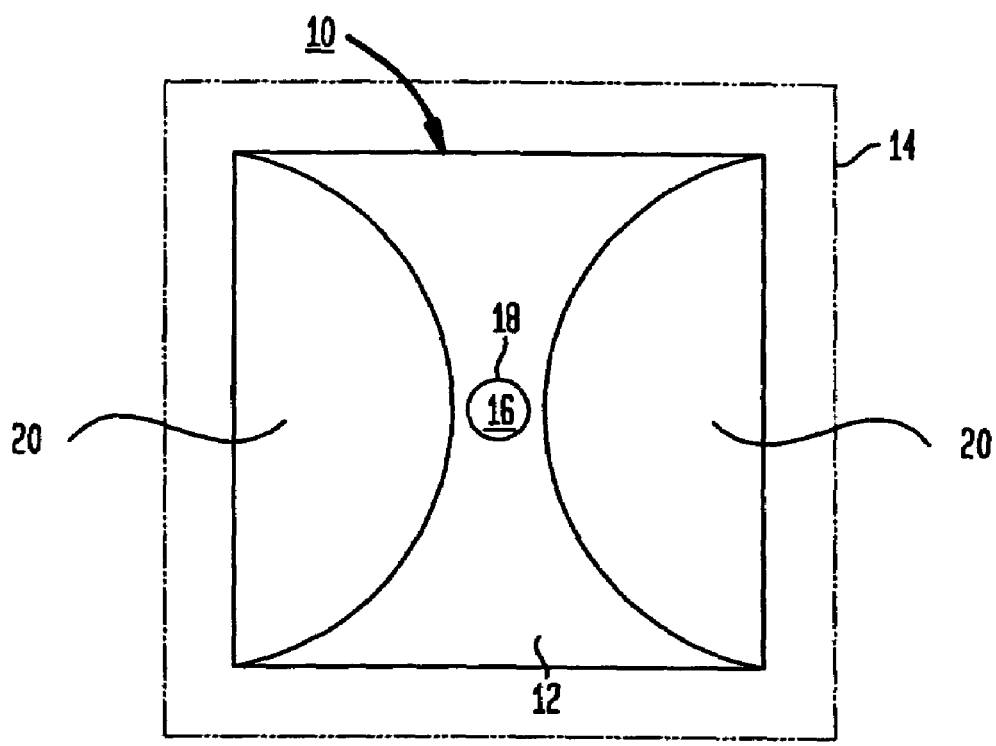
FIG. 1 illustrates a generally diagrammatic plan view of the inventive arrangement for adhesively connecting a heat spreader to a flip chip.

Referring now in particular to FIG. 1 of the drawings, there is illustrated a diagrammatic plan view of a flip chip 10, the backside 12 of which is adapted to be connected to a heat spreader 14, the latter of which is illustrated only in phantom lines. The heat spreader 14 may be a plate-shaped element, such as a lid or cap member, as is well known in the technology, and may be constituted of a metallic material; for instance, copper, silver, aluminum or any other suitable material, as its known in the art, having excellent heat dissipating properties for the absorption and removal of heat from the chip 10, which is generated during the operation of an electronic device.

As illustrated, the heat spreader 14 is positioned on the chip 10, in effect, the backside 12 of the flip chip, and in which a center portion or areal surface portion 16 of the chip backside surface displaced inwardly of the clip edges has an electrically conductive silicone adhesive 18 imparted thereto. The adhesive 18, per se, may be in the form of a spot and in a quantity which is sufficient to achieve at least a 1 mm diameter bonding area between the heat spreader 14 and the surface 12 of the chip 10. A typical bond line thickness present between the heat spreader 14 and a chip 10 may be in the range of between about 0.025 mm to 0.15 mm.

A thermally conductive, but electrically non-conductive thermosetting silicone adhesive 20 is then dispensed in a suitable pattern, as illustrated, onto the backside 12 of the chip 10 so as to cover most of the remaining chip backside surface extending about on the sides of the adhesive 18. Although shown in an essentially curvilinear deposited surface configuration, other types of configurations of the thermally conductive, electrically non-conductive silicone adhesive 20 may be arranged to extend about the electrically conductive silicone adhesive 18.

Figure 2:
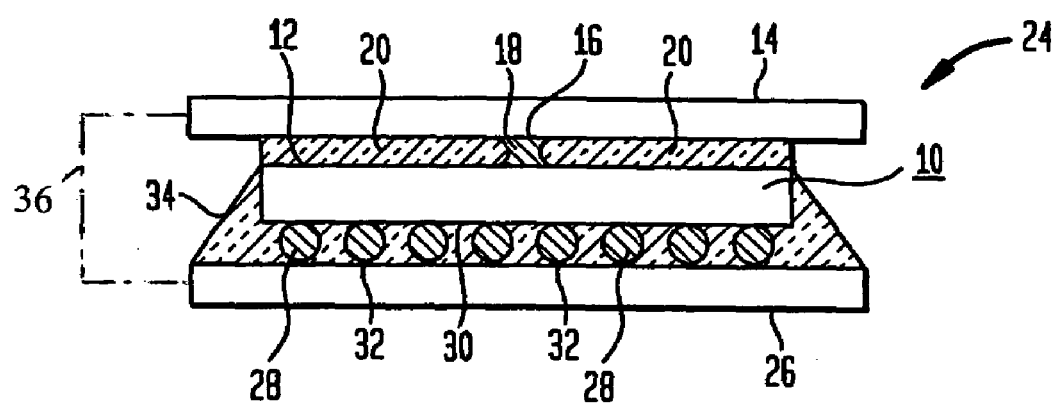
FIG. 2 illustrates a generally diagrammatic cross-sectional side view of an electronic component utilizing the inventive arrangement of concurrently applying electrically conductive and non-conductive thermosetting silicone adhesives between a heat spreader and a chip.

Pursuant to FIG. 2 of the drawings, there is shown a typical cross-sectional view of an electronic arrangement 24 in which a flip chip 10 is electrically connected to a substrate 26, the latter of which may be a circuit board, a laminated card or a ceramic. This electrical connection, as known in the art, may be provided through solder bumps 28 located between the surface 30 on the flip chip 10 opposite the backside 12 thereof and electrical contacts or pads 32 on the substrate 26. Encapsulating the solder bumps 28 may be a thermal, electrically non-conductive underfill material 34. As shown, the electrically non-conductive adhesive 20 encloses the electrically conductive adhesive in the gap between the chip backside 12 and the facing surface of the heat spreader 14. As diagrammatically illustrated by phantom-line 36 in FIG. 2, the heat spreader 14 may also be in electrical connection with the substrate 26, such as by means of a suitable electrically conductive adhesive, or wire bond, as known in the technology.

In essence, with an adhesive pattern, as illustrated in the drawings, although variations in configurations of application on the chip surface may be readily contemplated, the two types of adhesives 18, 20 upon curing and with the heat spreader 14 positioned on the backside 12 of the chip 10 will contact each other without entrapping any air inbetween. Moreover, the thermally conductive, electrically non-conductive adhesive 20 will effectively surround or encompass the centrally located spot of the electrically conductive silicone adhesive 18 to prevent the latter from spilling or running over the edges of the chip 10 onto the substrate or carrier surface 26 with a resultant potential of creating an electrical short in the electronic device, or producing signal-disruptive noises in signal circuits.

Inasmuch as both of these adhesives 18, 20 are silicones having somewhat similar coefficients of thermal expansion (CTEs), they are chemically compatible and, furthermore, with the location of the electrically conductive adhesive 18 in the center of the chip backside surface while being surrounded by the electronically non-conductive adhesive 20, any CTE mismatch induced stress is readily minimized. Consequently, this facilitates applications in which a grounding can be obtained using a non-silicone based electrically-conductive adhesive in conjunction with the electrically non-conductive silicone, in the event that it is contemplated to employ an epoxy for the electrically conductive adhesive rather than a silicone material.

From the foregoing, it becomes readily apparent that pursuant to the invention, there is achieved a simple arrangement of the electrical connection between a heat spreader 14 and a flip chip 10, reducing stresses caused by mismatches in CTE through the expedient of the two types of adhesives 18, 20 being disposed on the surface 12 of the chip 10.

While the present invention has been particularly shown and described with respect to preferred embodiments thereof, it will be understood by those skilled in the art that the foregoing and other changes in form and detail may be made without departing from the spirit and scope of the present invention. It is, therefore, intended that the present invention not be limited to the exact forms and details described and illustrated, but to fall within the scope of the appended claims.

What is claimed is:

1. An electronic device, comprising:
   a semiconductor chip having a first surface in electrical communication with a substrate;
   a heat spreader being arrayed in closely spaced relationship with an opposite surface of said semiconductor chip, said heat spreader being constituted of a heat-absorbing and dissipating material; and
   adhesive means bonding said heat spreader to said semiconductor chip, said adhesive means comprising an electrically conductive silicone adhesive positioned in an essentially single spot on a center or an areal surface portion of said semiconductor chip, wherein said electrically conductive adhesive is deposited on the areal surface portion of said semiconductor chip surface to form an about 1 mm diameter bond area with said heat spreader, said electrically conductive silicone adhesive electrically connecting said heat spreader with said semiconductor chip, and an electrically non-conductive silicone adhesive of an extensively larger surface area than said single spot formed by said electrically conductive silicone adhesive essentially consisting of a thermally conductive adhesive for conveying heat from said semiconductor chip to said heat spreader and extending about said electrically conductive silicone adhesive and extending into proximity with the edges of said semiconductor chip for concurrently bonding said heat spreader to said semiconductor chip and said electrically non-conductive adhesive being deposited on said semiconductor chip so as to cover essentially a major portion of the remaining surface area of said chip extending about said electrically conductive adhesive.

2. An electronic device, as claimed in claim 1, wherein said heat spreader comprises an electrically conductive material forming said electrical connection with said semiconductor chip through said electrically conductive adhesive.

3. An electronic device, as claimed in claim 2, wherein said heat spreader is selected from the group of materials consisting of copper, silver, aluminum, alumina or alumina silica carbide.

4. An electronic device, as claimed in claim 1, wherein said heat spreader comprises a plate-shaped lid or cap member adhesively bonded to said semiconductor chip.

5. An electronic device, as claimed in claim 1, wherein said heat spreader is spaced from said semiconductor chip to provide a bondline thickness of about 0.025 mm to 0.15 mm for said adhesives.

6. A method of forming an electronic device, said method comprising:
   providing a semiconductor chip having a first surface in electrical communication with a substrate;
   arranging a heat spreader in closely spaced relationship with an opposite surface of said semiconductor chip, said heat spreader being constituted of a heat-absorbing and dissipating material; and
   having adhesive means bond said heat spreader to said semiconductor chip, said adhesive means comprising an electrically conductive silicone adhesive positioned in an essentially single spot formed by said electrically conductive silicone adhesive on a center or an areal surface portion of said semiconductor chip, wherein said electrically conductive adhesive is deposited on the areal surface portion of said semiconductor chip surface to form an about 1 mm diameter bond area with said heat spreader, said electrically conductive silicone adhesive electrically connecting said heat spreader with said semiconductor chip, and an electrically non-conductive silicone adhesive essentially consisting of a thermally conductive adhesive for conveying heat from said semiconductor chip to said heat spreader and of an extensively larger surface area than said single spot extending about said electrically conductive silicone adhesive and extending into proximity with the edges of said semiconductor chip for concurrently bonding said heat spreader to said semiconductor chip and depositing said electrically non-conductive adhesive on said semiconductor chip so as to cover essentially a major portion of the remaining surface area of said chip extending about said electrically conductive adhesive.

7. A method, as claimed in claim 6, wherein said heat spreader comprises an electrically conductive material forming said electrical connection with said semiconductor chip through said electrically conductive adhesive.

8. A method, as claimed in claim 7, wherein said heat spreader is selected from the group of materials consisting of copper, silver, aluminum, alumina or alumina silica carbide.

9. A method, as claimed in claim 6, wherein said heat spreader comprises a plate-shaped lid or cap member adhesively bonded to said semiconductor chip.

10. A method, as claimed in claim 6, wherein said heat spreader is spaced from said semiconductor chip to provide a bondline thickness of about 0.025 mm to 0.15 mm for said adhesives.

* * * * *